United States Patent
Kim et al.

(10) Patent No.: US 7,294,864 B2
(45) Date of Patent: Nov. 13, 2007

(54) FLIP CHIP TYPE NITRIDE SEMICONDUCTOR LIGHT-EMITTING DIODE

(75) Inventors: Dong Joon Kim, Seoul (KR); Hyun Kyung Kim, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 225 days.

(21) Appl. No.: 10/925,934

(22) Filed: Aug. 26, 2004

(65) Prior Publication Data
US 2005/0269588 A1 Dec. 8, 2005

(30) Foreign Application Priority Data
Jun. 3, 2004 (KR) .............................. 2004-40355

(51) Int. Cl.
*H01L 33/00* (2006.01)
(52) U.S. Cl. .................. 257/98; 257/99; 257/E33.065
(58) Field of Classification Search ............... 257/91, 257/99, 103, E33.066, E33.065, E33.072, 257/745, 98
See application file for complete search history.

(56) References Cited

U.S. PATENT DOCUMENTS

| | | | |
|---|---|---|---|
| 5,218,216 | A | 6/1993 | Manabe et al. |
| 2004/0012013 | A1 | 1/2004 | Katayama |
| 2004/0140474 | A1* | 7/2004 | Ueda et al. .................. 257/79 |
| 2005/0087884 | A1* | 4/2005 | Stokes et al. ................ 257/778 |

FOREIGN PATENT DOCUMENTS

| | | |
|---|---|---|
| JP | 05 291618 | 11/1993 |
| JP | 2001 203386 | 7/2001 |
| JP | 2003 101068 | 4/2003 |
| JP | 2004 071655 | 3/2004 |
| JP | 2004 327729 | 11/2004 |
| WO | 2004/23569 | 3/2004 |

OTHER PUBLICATIONS

Japanese Patent Office, Office Action mailed Jun. 19, 2007 and English Translation.

* cited by examiner

*Primary Examiner*—Minh-Loan Tran
(74) *Attorney, Agent, or Firm*—Lowe Hauptman & Berner

(57) ABSTRACT

A flip chip type nitride semiconductor light-emitting diode includes a light-transmissive substrate for growing nitride single crystals; an n-type nitride semiconductor layer formed on the light-transmissive substrate; an active layer formed on the n-type nitride semiconductor layer; a p-type nitride semiconductor layer formed on the active layer; a mesh-type dielectric layer formed on the p-type nitride semiconductor layer and having a mesh structure with a plurality of open regions in which the p-type nitride semiconductor layer is exposed; a highly reflective ohmic contact layer formed on the mesh-type dielectric layer and the open regions in which the p-type nitride semiconductor layer is exposed; and a p-bonding electrode and an n-electrode formed on the highly reflective ohmic contact layer and the n-type nitride semiconductor layer, respectively.

11 Claims, 3 Drawing Sheets

FLIP CHIP TYPE NITRIDE SEMICONDUCTOR LIGHT-EMITTING DIODE

RELATED APPLICATIONS

The present application is based on, and claims priority from, Korean Application Number 2004-40355, filed Jun. 3, 2004, the disclosure of which is hereby incorporated by reference herein in its entirety.

BACKGROUND OF THE INVENTION

1. Field of the Invention

The present invention relates to a nitride semiconductor light-emitting diode, and more particularly to a flip chip type nitride semiconductor light-emitting diode having excellent electrical properties and luminance.

2. Description of the Related Art

Recently, a great deal of attention has been directed to nitride semiconductors using nitrides such as GaN, as a photoelectric material and a main core material for electronic devices, since they have excellent physical and chemical properties. In particular, a nitride semiconductor light-emitting diode produces green and blue color light and further light within the UV region, and as a result of technology advancement, has a marked improvement in luminance thereof, therefore it is also applied to full color sign boards, illumination devices, and the like.

Such a nitride semiconductor light-emitting diode is a light-emitting diode to obtain light with a blue or green wavelength and is made of a semiconductor material having the formula of $Al_xIn_yGa_{(1-x-y)}N$ wherein x, y and the sum of x and y are independently between 0 and 1. Nitride semiconductor crystals are grown on a substrate, such as a sapphire substrate, for growing nitride single crystals from a standpoint of lattice matching therebetween. The sapphire substrate is electrically insulative and thus, a final nitride semiconductor light-emitting diode has a structure having both p- and n-electrodes formed on the same surface.

Due to such structural characteristics, the nitride semiconductor light-emitting diode has been actively developed to have a configuration suitable for a flip chip structure. FIG. 1 shows a flip chip type light-emitting device in which a conventional nitride semiconductor light-emitting diode was mounted.

Referring to FIG. 1, the flip chip type light-emitting device; which is designated by reference numeral 20, includes a nitride semiconductor light-emitting diode 10 mounted on a support substrate 21. The nitride semiconductor light-emitting diode 10 includes a sapphire substrate 11, and an n-type nitride semiconductor layer 12, an active layer 13 and a p-type nitride semiconductor layer 14 sequentially laminated thereon. Further, the nitride semiconductor light-emitting diode 10 may be mounted on the support substrate 21 by fusing respective electrodes 19a and 19b on respective lead patterns 22a and 22b via conductive bumps 24a and 24b. In this flip chip structure 20, the sapphire substrate 11 of the light-emitting diode 10 is light-transmissive and thus may be employed as a light-emitting side.

As shown in FIG. 1, an electrode of the flip chip type nitride semiconductor light-emitting diode, particularly a p-electrode, is required to have high reflectivity capable of reflecting light emitted from the active layer 13 toward a light-emitting side while forming ohmic contact with the p-type nitride semiconductor layer 14. Therefore, as shown in FIG. 1, the p-electrode structure may include an ohmic contact layer 15 with high reflectivity formed on the p-type nitride semiconductor layer 14 and a metal barrier layer 16 for preventing diffusion of components of the ohmic contact layer 15.

However, the nitride semiconductor light-emitting diode 10 shown in FIG. 1 has a planar electrode structure. In particular, the p-type ohmic contact layer 15 has a relatively lower resistivity compared to the p-type nitride semiconductor layer 14, and thus electric current crowding occurs, in which a large portion of electric current is concentrated in a region designated by "A" adjacent to the n-electrode, along the ohmic contact layer 15, as shown by arrow.

This electric current crowding not only increases a forward voltage, but also reduces light-emitting efficiency of the active layer spaced relative to the n-electrode, thereby decreasing luminance characteristics thereof. In addition, the region A in which the electric current is concentrated has an increased heat value, thus significantly deteriorating reliability of the diode.

SUMMARY OF THE INVENTION

Therefore, the present invention has been made in view of the above problems, and it is an object of the present invention to provide a nitride semiconductor light-emitting diode having a relatively low forward voltage and high light-emitting efficiency by improving the p-electrode structure so as to alleviate the electric current crowding phenomenon.

In accordance with the present invention, the above and other objects can be accomplished by the provision of a flip chip type nitride semiconductor light-emitting diode comprising:

a light-transmissive substrate for growing nitride single crystals;

an n-type nitride semiconductor layer formed on the light-transmissive substrate;

an active layer formed on the n-type nitride semiconductor layer;

a p-type nitride semiconductor layer formed on the active layer;

a mesh-type dielectric layer formed on the p-type nitride semiconductor layer and having a mesh structure with a plurality of open regions in which the p-type nitride semiconductor layer is exposed;

a highly reflective ohmic contact layer formed on the mesh-type dielectric layer and the open regions in which the p-type nitride semiconductor layer is exposed; and a p-bonding electrode and an n-electrode formed on the highly reflective ohmic contact layer and the n-type nitride semiconductor layer, respectively.

Preferably, the sum of areas of open regions of the mesh-type dielectric layer may be more than 30% of that of the upper surface of the p-type nitride semiconductor layer. The refractive index of the mesh-type dielectric layer should be lower than that of the p-type nitride semiconductor layer. The mesh-type dielectric layer which can be used in the present invention may be made of oxides or nitrides containing elements selected from the group consisting of Si, Zr, Ta, Ti, In, Sn, Mg and Al.

The nitride semiconductor light-emitting diode in accordance with the present invention has characteristics such that a portion of the light produced at the interface between the mesh-type dielectric layer and the p-type nitride semiconductor layer is reflected, and the light having passed through the mesh-type dielectric layer is reflected at an interface between the mesh-type dielectric layer and the highly reflective ohmic contact layer. At this time, by adjusting the thickness of the mesh-type dielectric layer, the light reflected at the interface between the mesh-type dielectric layer and the p-type nitride semiconductor layer and the light reflected at the interface between the mesh-type dielectric layer and the highly reflective ohmic contact layer can exhibit constructive interference therebetween, thus being capable of emitting higher luminance light. As such, in order to produce constructive interference between two reflected lights, the thickness of the mesh-type dielectric layer can be calculated according to the following equation:

$$d = \frac{\lambda}{4n} \times 1, 3, 5, 7, \ldots \quad \text{(equation 1)}$$

wherein d represents the thickness of the mesh-type dielectric layer, $\lambda$ represents the light wavelength, and n represents the refractive index of the mesh-type dielectric layer.

Further, the reflectivity of the highly reflective ohmic contact layer is preferably more than 70%. The highly reflective ohmic contact layer which can be used in the present invention may include at least one layer made of material selected from the group consisting of Ag, Ni, Al, Rh, Pd, Ir, Ru, Mg, Zn, Pt, Au and any combinations thereof. More preferably, the highly reflective ohmic contact layer may include a first layer made of material selected from the group consisting of Ni, Pd, Ir, Pt and Zn, and a second layer formed on the first layer and made of material selected from the group consisting of Ag and Al. Most preferably, the highly reflective ohmic contact layer may include the first layer made of Ni, the second layer formed on the first layer and made of Ag, and a third layer formed on the second layer and made of Pt.

Preferably, the nitride semiconductor light-emitting diode in accordance with the present invention may further include a metal barrier layer surrounding the highly reflective ohmic contact layer. The metal barrier layer may include at least one layer made of material selected from the group consisting of Ni, Al, Cu, Cr, Ti and any combinations thereof.

As used herein, the term "a flip chip type nitride semiconductor light-emitting diode" means a light-emitting diode used in a flip chip structure of a light-emitting device, and specifically, a light-emitting diode in which a surface having a p-bonding electrode and an n-electrode formed thereon becomes a mounting surface attached to a substrate of the light-emitting device.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 2A:
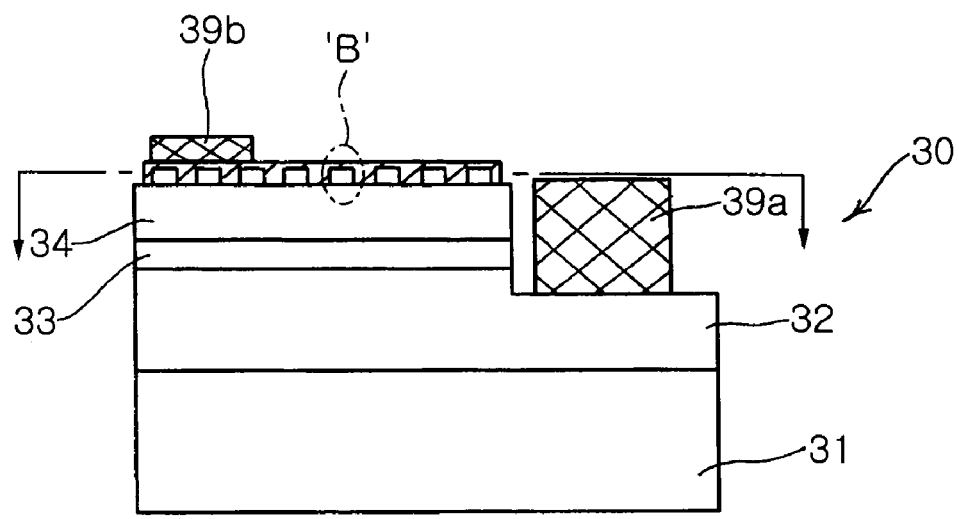
FIGS. 2a and 2b are, respectively, a cross-sectional side view and a top plan view of a flip chip type nitride semiconductor light-emitting diode in accordance with one embodiment of the present invention.
Figure 2B:
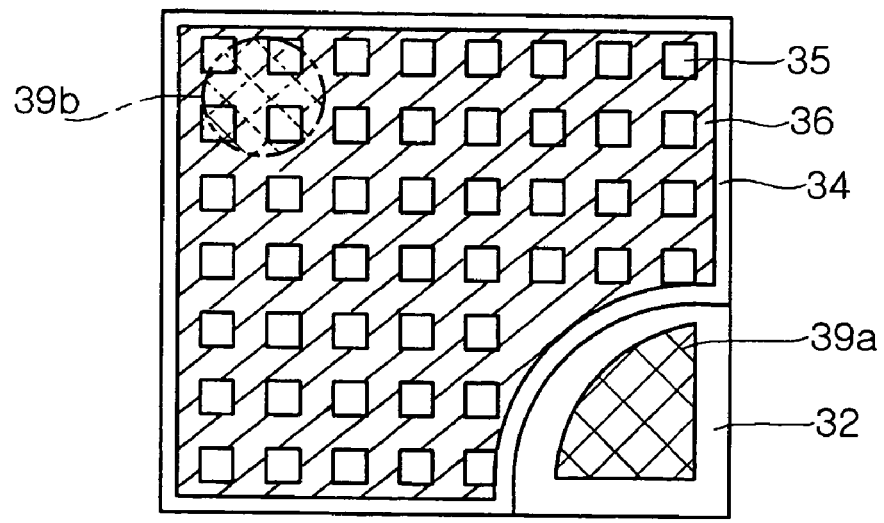

Preferred embodiments of the present invention will now be described in detail with reference to the annexed drawing. FIGS. 2a and 2b are, respectively, a cross-sectional side view and top plan view of a flip chip type nitride semiconductor light-emitting diode in accordance with one embodiment of the present invention.

Referring to FIG. 2a, a flip chip type nitride semiconductor light-emitting diode 30 in accordance with one embodiment of the present invention comprises: a light-transmissive substrate 31 for growing nitride single crystals; an n-type nitride semiconductor layer 32 formed on the light-transmissive substrate 31; an active layer 33 formed on the n-type nitride semiconductor layer 32; a p-type nitride semiconductor layer 34 formed on the active layer 33; a mesh-type dielectric layer 35 formed on the p-type nitride semiconductor layer 34 and having a mesh structure with a plurality of open regions in which the p-type nitride semiconductor layer 34 is exposed; a highly reflective ohmic contact layer 36 formed on the mesh-type dielectric layer 35 and the open region in which the p-type nitride semiconductor layer 34 is exposed; and a p-bonding electrode 39b and an n-electrode 39a formed on the highly reflective ohmic contact layer 36 and the n-type nitride semiconductor layer 32, respectively. The respective components of the nitride semiconductor light-emitting diode 30 in accordance with the above-mentioned embodiment will be described in more detail as below.

As the light-transmissive substrate 31, since there is no commercially available substrate which has the same crystal structure as crystals of nitride semiconductor material growing thereon while exhibiting lattice matching, a sapphire substrate is primarily used from the standpoint of the lattice matching. The sapphire substrate is a crystal body having Hexa-Rhombo R3c symmetry, and has characteristics such as a lattice constant of 13.001 Å in the direction of the c-axis, a distance between lattices of 4.765 Å in the direction of the a-axis, and a C (0001) plane, A (1120) plane and R (1102) plane in the direction of the orientation plane of the sapphire. On this C plane of the sapphire substrate, a GaN thin film is easily grown, and is stable at a high temperature and thus the sapphire substrate is primarily used as the substrate for blue or green light-emitting diodes.

The n-type nitride semiconductor layer 32 may be made of n-doped semiconductor material having the formula of $Al_xIn_yGa_{(1-x-y)}N$ wherein x, y, and the sum of x and y are independently between 0 and 1. Representative nitride semiconductor materials include GaN, AlGaN and GaInN. As impurities which may be used in doping the n-type nitride semiconductor layer 32, there may be mentioned Si, Ge, Se, Te or C. The n-type nitride semiconductor layer 32 may be formed by growing the semiconductor material on the light-transmissive substrate 31 using known vapor deposition process such as Metal Organic Chemical Vapor Deposition (MOCVD), Molecular Beam Epitaxy (MBE) or Hybrid Vapor Phase Epitaxy (HVPE).

Generally, a buffer layer for alleviating lattice mismatching may be formed between the light-transmissive substrate 31 and the n-type nitride semiconductor layer 32. As the buffer layer, a low temperature nucleus-growth layer made of GaN or AlN having a thickness of several tens of nm may be usually used.

The active layer 33 is a layer designed for emitting light and is made of a nitride semiconductor layer of GaN or InGaN having a single or multiple quantum well structure. The active layer 33 may be formed on the n-type nitride semiconductor layer 32 using known vapor deposition processes such as MOCVD, MBE or HVPE, as described in the n-type nitride semiconductor layer 32.

Similar to the n-type nitride semiconductor layer 32, the p-type nitride semiconductor layer 34 may be made of p-doped semiconductor material having the formula of $Al_xIn_yGa_{(1-x-y)}N$ wherein x, y, and the sum of x and y are independently between 0 and 1. Representative nitride semiconductor material includes GaN, AlGaN and GaInN. As impurities which may be used in doping the p-type nitride semiconductor layer 34, there may be mentioned Mg, Zn or Be. The p-type nitride semiconductor layer 34 may be formed by growing the semiconductor material on the active layer 33 using known vapor deposition process such as MOCVD, MBE or HVPE.

The mesh-type dielectric layer 35 may have a mesh structure having a plurality of open regions in which the p-type nitride semiconductor layer 34 is exposed. The mesh-type dielectric layer 35 may be made of material having a lower refractive index than that of the p-type nitride semiconductor layer 34. For example, the layer 35 may be made of material such as oxides or nitrides containing elements selected from the group consisting of Si, Zr, Ta, Ti, In, Sn, Mg and Al.

Figure 1:
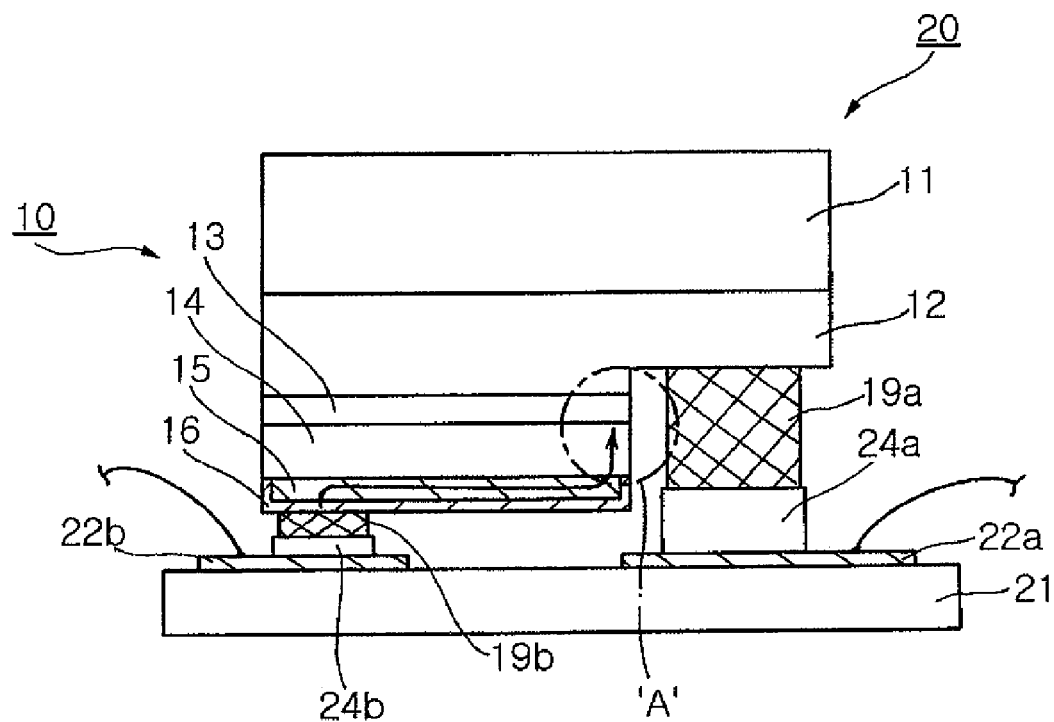
FIG. 1 is a cross-sectional side view of a flip structure of a light-emitting device in which a conventional nitride semiconductor light-emitting diode was mounted.
Figure 3:
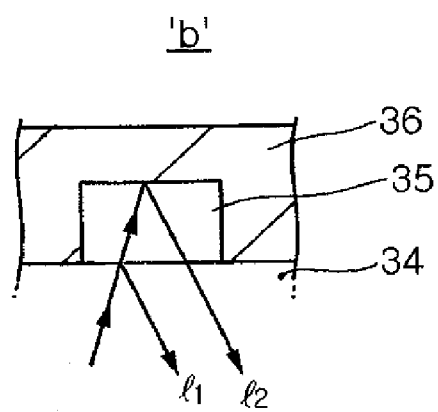
FIG. 3 is an enlarged view showing light reflection occurring in a region designated by "B" in FIG. 2.

A portion of the light produced in the active layer 33 is partly reflected at the interface (for convenience, hereinafter, referred to as the first interface) between the mesh-type dielectric layer 35 and the p-type nitride semiconductor layer 34, and most of it is reflected at the interface (hereinafter, referred to as the second interface) between the mesh-type dielectric layer 35 and the highly reflective ohmic contact layer 36. This will be more clearly understood by referring to FIG. 3. FIG. 3 is an enlarged view of the region designated by "B" in FIG. 2a. Referring to FIG. 3, a portion of the light produced from the active layer is partly reflected at the first interface, which is positioned between the mesh-type dielectric layer 35 having a refractive index of about 1.5 and the p-type nitride semiconductor layer 34 having a refractive index of about 2.4 toward the light-transmissive substrate ($l_1$). In addition, the light having passed through the mesh-type dielectric layer 35 is reflected at the second interface, which is positioned between the highly reflective ohmic contact layer 36 formed on the mesh-type dielectric layer 35 and the mesh-type dielectric layer 35 ($l_2$).

In particular, upon determining the thickness of the mesh-type dielectric layer 35 such that the light $l_1$ reflected from the first interface and the light $l_2$ that was reflected from the second interface and then emitted again onto the p-type nitride semiconductor layer 34 have the same phase, both lights $l_1$ and $l_2$ may produce constructive interference therebetween to further increase luminance. The thickness of the mesh-type dielectric layer 35 capable of generating constructive interference between two reflected lights can be calculated according to the following equation:

$$d = \frac{\lambda}{4n} \times 1, 3, 5, 7, \ldots \quad \text{(equation 1)}$$

wherein d represents the thickness of the mesh-type dielectric layer, $\lambda$ represents the light wavelength, and n represents the refractive index of the mesh-type dielectric layer.

Referring back to FIG. 2a, the highly reflective ohmic contact layer 36 is formed on the mesh-type dielectric layer and the open regions in which the p-type nitride semiconductor layer is exposed.

The highly reflective ohmic contact layer 36 is required to be formed of material which is suitable to lower contact resistance with the p-type nitride semiconductor layer 34 having a relatively high energy band gap, while at the same time, having a high reflectivity from the standpoint of structural aspects of the flip chip type nitride light-emitting diode. In order to satisfy these conditions such as contact resistance improvement and high reflectivity, the highly reflective ohmic contact layer 36 may be formed of at least one layer of material selected from the group consisting of Ag, Ni, Al, Rh, Pd, Ir, Ru, Mg, Zn, Pt, Au and any combinations thereof. Preferably, the highly reflective ohmic contact layer 36 has a reflectivity of more than 70%. More preferably, the highly reflective ohmic contact layer 36 may be formed of a bilayer structure including a first layer made of material selected from the group consisting of Ni, Pd, Ir, Pt and Zn, and a second layer formed on the first layer and made of material selected from the group consisting of Ag and Al. Most preferably, the highly reflective ohmic contact layer 36 may be formed of a three-layer structure including a first layer made of Ni, a second layer formed on the first layer and made of Ag, and a third layer formed on the second layer and made of Pt. The highly reflective ohmic contact layer 36 may be formed by using known vapor deposition process such as Chemical Vapor Deposition (CVD) and E-beam evaporator or a process such as sputtering. The layer 36 may be heat treated at a temperature of about 400 to 900° C. to improve ohmic contact characteristics.

The mesh-type dielectric layer 35 has a mesh structure, and thus the highly reflective ohmic contact layer 36 will be in contact with the upper surface of the p-type nitride semiconductor layer 34 in the open regions as described above. Therefore, an interface (hereinafter, referred to as a third interface) between the highly reflective ohmic contact layer 36 and the p-type nitride semiconductor layer 34 has a substantially mesh-like shape. The highly reflective ohmic contact layer 36 has a substantially mesh-like structure, and thus an electric current path toward for the n-electrode 39a along the highly reflective ohmic contact layer 36 from the p-bonding electrode 39b will relatively be long. Therefore, when the light-emitting diode operates, a phenomenon in which electric current is concentrated in the region adjacent to the n-electrode 39a is alleviated. At the same time, a tendency in which electric current progresses toward the p-type nitride semiconductor layer 34 increases, thereby alleviating a problem associated with electric current crowding.

By referring to FIG. 2b in conjunction with FIG. 2a, the principle of how the electric current crowding phenomenon is alleviated by the highly reflective ohmic contact layer 36 having a mesh structure used in the present invention will be easily understood. Due to characteristics of the mesh structure as shown in FIG. 2b, electric current progressing along the highly reflective ohmic contact layer 36 having lower resistivity than that of the p-type nitride semiconductor layer 34 will have a long path (for example, as designated by arrows in FIG. 2b) to reach the n-electrode 39a. Therefore, as shown in FIG. 2a, the influence of electric current directed toward the p-type nitride semiconductor layer 34 may be relatively increased. Therefore, the problem of electric current crowding can be alleviated and at the same time, more uniform light-emitting can be anticipated in the active layer 33, leading to improvement of diode reliability and significant increase of light-emitting efficiency thereof. Additionally, it is possible to reflect light at the first, second and third interfaces toward the light-transmissive substrate while using the mesh structure, thus securing higher luminance characteristics in a flip structure.

With the highly reflective ohmic contact layer 36 of the present invention having a substantially mesh-like structure thereon only, it is possible to sufficiently alleviate the problems associated with electric current crowding. However, in order to improve efficiency of electric current injection and form ohmic contact with the p-type nitride semiconductor layer 34, the area of the third interface is preferably more than 30% of the total upper surface area of the p-type nitride semiconductor layer 34. Thus, the mesh-type dielectric layer 35 is preferably formed such that the area of open regions in which the upper surface of the p-type nitride semiconductor layer 34 is exposed is 30% of the total upper surface area of the p-type nitride semiconductor layer 34.

The n-electrode 39a may take a single layer or multi-layer form made of material selected from the group consisting of Ti, Cr, Al, Cu and Au, formed on the n-type nitride semiconductor layer 32. The n-electrode 39a may be formed on the n-type nitride semiconductor layer 32 by using known vapor deposition processes such as CVD and E-beam evaporator or a process such as sputtering.

The p-bonding electrode 39b is formed on the highly reflective ohmic contact layer 36. The p-bonding electrode 39b is the outermost electrode layer to be mounted on lead patterns via a conductive bump in the flip chip structure. Generally, it may be formed using material such as Au or Au-containing alloy by known vapor deposition processes such as CVD and E-beam evaporator or a process such as sputtering.

Figure 4A:
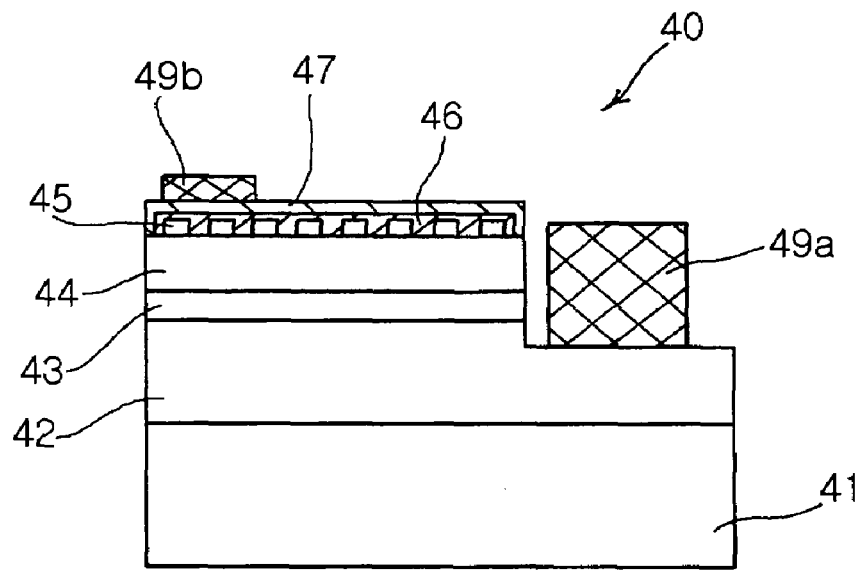
FIGS. 4a and 4b are, respectively, a cross-sectional side view of a flip chip type nitride semiconductor light-emitting diode in accordance with another embodiment of the present invention and a cross-sectional side view of a flip chip structure of a light-emitting device using the same.

FIG. 4a shows a cross-sectional side view of a flip chip type nitride semiconductor light-emitting diode in accordance with another embodiment of the present invention.

Referring to FIG. 4a, a flip chip type nitride semiconductor light-emitting diode 40 according to this embodiment includes a light-transmissive substrate 41 for growing a nitride semiconductor, such as a sapphire substrate, and an n-type nitride semiconductor layer 42, an active layer 43 and a p-type nitride semiconductor layer 44 sequentially laminated on the upper surface of the substrate 41. It further includes a mesh-type dielectric layer 45 formed on the p-type nitride semiconductor layer 44 and having a mesh structure with a plurality of open regions in which the p-type nitride semiconductor layer 44 is exposed, a highly reflective ohmic contact layer 46 formed on the mesh-type dielectric layer 45 and the open regions in which the p-type nitride semiconductor layer 44 is exposed, and a metal barrier layer 47 surrounding the highly reflective ohmic contact layer 46. In addition, an n-electrode 49a of the flip chip type nitride semiconductor light-emitting diode 40 in accordance with this embodiment is formed on the upper surface of the n-type nitride semiconductor layer 42 exposed by mesa etching. The p-bonding electrode 49 is formed on the upper surface of the metal barrier layer 47.

The flip chip type nitride semiconductor light-emitting diode 40 in accordance with this embodiment has a structure further including the metal barrier layer 47 surrounding the highly reflective ohmic contact layer in the embodiment of the present invention explained by FIG. 2a.

The metal barrier layer 47 used in this embodiment is formed by surrounding the highly reflective ohmic contact layer. The metal barrier layer 47 is used as a layer for preventing deterioration of characteristics of the ohmic contact layer (in particular, reflectivity and contact resistance) by being compatibilized at the interface between material constituting the p-bonding electrode 49b and material constituting the highly reflective ohmic contact layer 46. That is, the metal barrier layer 47 serves as a barrier for preventing Au components from being mixed at the interface between the p-bonding electrode 49b and the highly reflective ohmic contact layer 46. Further, at the same time, where the highly reflective ohmic contact layer contains Ag, the metal barrier layer 47 also serves to effectively prevent the electric current leakage due to Ag migration.

This metal barrier layer 47 may take a single layer or multi-layer form made of material selected from the group consisting of Ni, Al, Cu, Cr, Ti and any combinations thereof. Similar to other electrodes, the metal barrier layer 47 may be formed by conventional vapor deposition or sputtering processes. The metal barrier layer 47 may be heat treated at a temperature of about 300° C. for several tens of second to several minutes in order to improve adherence thereof.

Figure 4B:
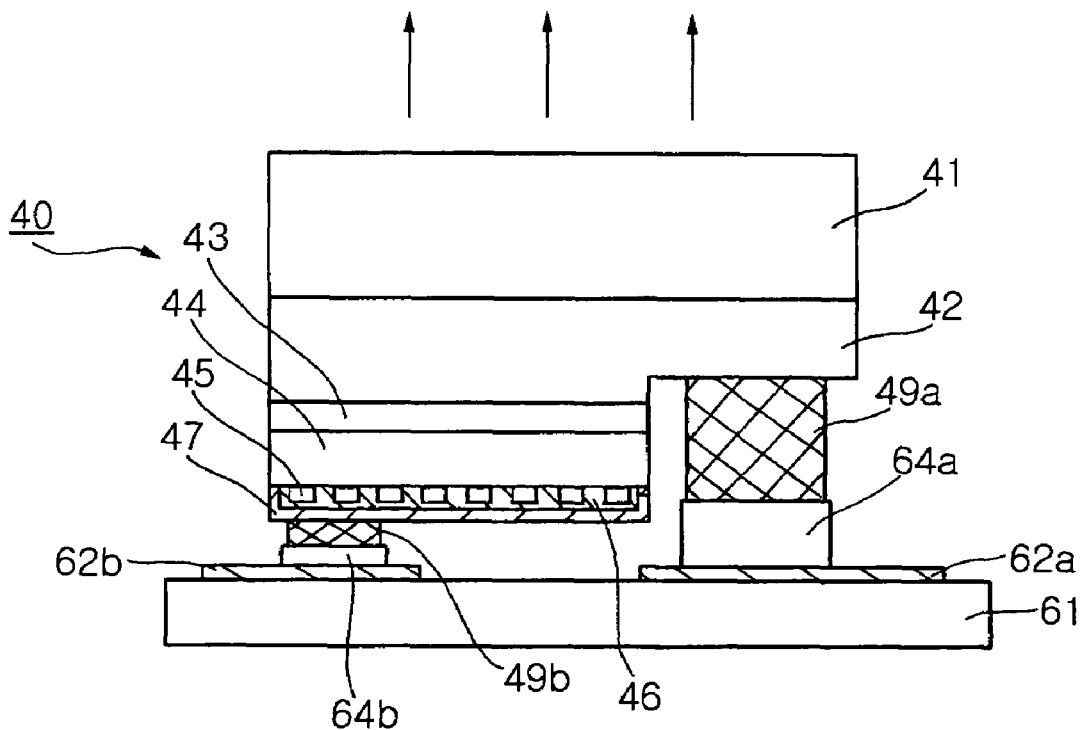

FIG. 4b shows a cross-sectional side view of a flip chip structure 50 having the nitride semiconductor light-emitting diode 40 of FIG. 4a mounted thereon.

As shown in FIG. 4b, the nitride semiconductor light-emitting diode 40 may be mounted on a support substrate 61 by fusing respective electrodes 49a and 49b on respective lead patterns 62a and 62b via conductive bumps 64a and 64b. As illustrated before, in this flip chip light-emitting device 50, a sapphire substrate 41 of the nitride semiconductor light-emitting diode 40 is light-transmissive and thus is employed as a light-emitting side. A mesh-type dielectric layer 45 forms a substantially mesh-shaped highly reflective ohmic contact layer 46, thereby improving contact resistance with the p-type nitride semiconductor layer 44 and effect of electric current injection, and at the same time, secures higher reflectivity, resulting in increased amount of light directed toward the light-emitting side leading to high luminance characteristics. In particular, adjusting the thickness of the mesh-type dielectric layer 45 induces constructive interference between lights reflected at the first and second interfaces resulting in higher luminance characteristics.

As apparent from the above description, in accordance with the present invention, formation of the substantially mesh-like highly reflective ohmic contact layer on the open regions of the mesh-type dielectric layer by using a mesh structure of the mesh-type dielectric layer on the p-type nitride semiconductor layer of the flip chip type nitride semiconductor light-emitting diode reduces the concentration of electric current in the region adjacent to the n-electrode and increases the amount of electric current toward the p-type nitride semiconductor layer, thus greatly alleviating electric current crowding. Thus, the flip chip type nitride semiconductor light-emitting diode in accordance with the present invention has a lower forward voltage and high light-emitting efficiency, and also effectively prevents degradation thereof resulting in significant improvement of reliability thereof.

Additionally, a portion of light at the interface between the mesh-type dielectric layer and the p-type nitride semiconductor layer is partly reflected toward a light-emitting side, and in turn, the remaining light at the interface between the mesh-type dielectric layer and the highly reflective ohmic contact layer is reflected toward light-emitting side, thus obtaining high luminance characteristics in the flip chip structure. Also, adjusting the thickness of the mesh-type dielectric layer may induce constructive interference between two reflected lights thus securing higher luminance characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A flip chip nitride semiconductor light-emitting diode, comprising:
    a light-transmissive substrate for growing nitride single crystals;
    an n-type nitride semiconductor layer formed on the light-transmissive substrate;
    an active layer formed on the n-type nitride semiconductor layer;
    a p-type nitride semiconductor layer formed on the active layer;
    a dielectric layer formed on the p-type nitride semiconductor layer and having a mesh structure with a plurality of open regions in which the p-type nitride semiconductor layer is exposed;
    a reflective ohmic contact layer formed on the dielectric layer and the open regions in which the p-type nitride semiconductor layer is exposed; and
    a p-bonding electrode and an n-electrode formed on the reflective ohmic contact layer and the n-type nitride semiconductor layer, respectively;
    wherein the thickness of the dielectric layer satisfies the following equation:

$$d = \frac{\lambda}{4n} \times 1, 3, 5, 7, \ldots$$

wherein d represents the thickness of the dielectric layer, $\lambda$ represents the light wavelength, and n represents the refractive index of the dielectric layer.

2. The diode as set forth in claim 1, wherein the sum of areas of the open regions of the dielectric layer is more than 30% of that of the upper surface of the p-type nitride semiconductor layer.

3. The diode as set forth in claim 1, wherein a the refractive index of the dielectric layer is lower than that of the p-type nitride semiconductor layer.

4. The diode as set forth in claim 1, wherein the dielectric layer is made of oxides or nitrides containing elements selected from the group consisting of Si, Zr, Ta, Ti, In, Sn, Mg and Al.

5. The diode as set forth in claim 1, wherein the reflective ohmic contact layer has a reflectivity of more than 70%.

6. The diode as set forth in claim 1, wherein the reflective ohmic contact layer includes at least one layer made of material selected from the group consisting of Ag, Ni, Al, Rh, Pd, Ir, Ru, Mg, Zn, Pt, Au and any combinations thereof.

7. The diode as set forth in claim 1, wherein the reflective ohmic contact layer includes a first layer made of material selected from the group consisting of Ni, Pd, Ir, Pt and Zn, and a second layer formed on the first layer and made of material selected from the group consisting of Ag and Al.

8. The diode as set forth in claim 1, wherein the reflective ohmic contact layer includes the first layer made of Ni, the second layer formed on the first layer and made of Ag, and a third layer formed on the second layer and made of Pt.

9. The diode as set forth in claim 1, further comprising a metal barrier layer surrounding the reflective ohmic contact layer.

10. The diode as set forth in claim 9, wherein the metal barrier layer includes at least one layer made of material selected from the group consisting of Ni, Al, Cu, Cr, Ti and any combinations thereof.

11. A flip chip nitride semiconductor light-emitting diode having n- and p-type nitride semiconductor layers formed on a substrate, said diode comprising:
    a dielectric layer formed on the p-type nitride semiconductor layer and having a mesh structure with a plurality of open regions in which the p-type nitride semiconductor layer is exposed;
    a reflective ohmic contact layer formed on the dielectric layer; and
    a p-bonding electrode formed on the reflective ohmic contact layer;
    wherein the thickness of the dielectric layer satisfies the following equation:

$$d = \frac{\lambda}{4n} \times 1, 3, 5, 7, \ldots$$

wherein d represents the thickness of the dielectric layer, $\lambda$ represents the light wavelength, and n represents the refractive index of the dielectric layer.

* * * * *